United States Patent [19]

Hess et al.

[11] Patent Number: 5,019,722
[45] Date of Patent: May 28, 1991

[54] THRESHOLD CROSSING DETECTION WITH IMPROVED NOISE REJECTION

[75] Inventors: Robert M. Hess, Arlington Heights; Roy E. Hunninghaus, Des Plaines, both of Ill.

[73] Assignee: Motorola, Inc., Schaumburg, Ill.

[21] Appl. No.: 489,983

[22] Filed: Mar. 5, 1990

[51] Int. Cl.$^5$ .............................................. H03K 5/153
[52] U.S. Cl. ................................... 307/354; 307/360; 328/164
[58] Field of Search ................ 307/268, 360, 362, 354; 328/150, 164

[56] References Cited

U.S. PATENT DOCUMENTS

| | | | |
|---|---|---|---|
| 3,727,079 | 4/1973 | Garrett | 307/354 |
| 3,801,830 | 4/1974 | Boyer. | |
| 3,944,936 | 3/1976 | Pryor. | |
| 3,991,733 | 11/1976 | Harris. | |
| 4,045,743 | 8/1977 | Walker | 307/354 |
| 4,789,838 | 12/1988 | Cheng | 328/150 |
| 4,795,915 | 1/1989 | Sun et al. . | |
| 4,924,483 | 5/1990 | Cho | 307/354 |

*Primary Examiner*—John Zazworsky
*Attorney, Agent, or Firm*—John H. Moore

[57] ABSTRACT

A detection scheme processes the output signal from a sensor so as to provide an ultimate output signal that is more noise resistant and that has a transition representative of a threshold crossing in the sensor signal. A key part of the detection scheme utilizes an integrated version of the sensor's output signal and compares it to two reference levels. These reference levels are selected to be near the opposite extremes of the amplitude excursions of the integrated sensor signal. Each time the reference levels are exceeded, a binary signal is latched to one of two levels (e.g. high, low), and is further processed to provide the ultimate output signal that is free of multiple, unwanted transitions in the presence of noise.

10 Claims, 2 Drawing Sheets

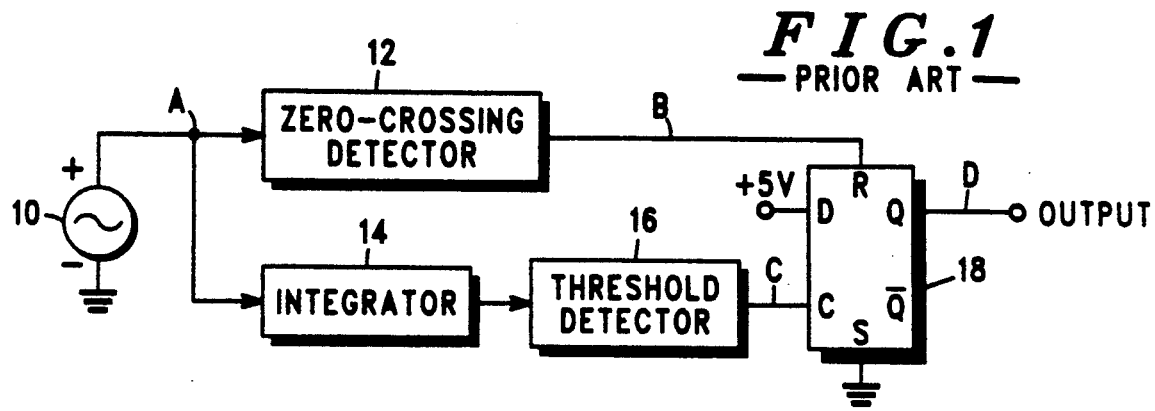
FIG.1 —PRIOR ART—
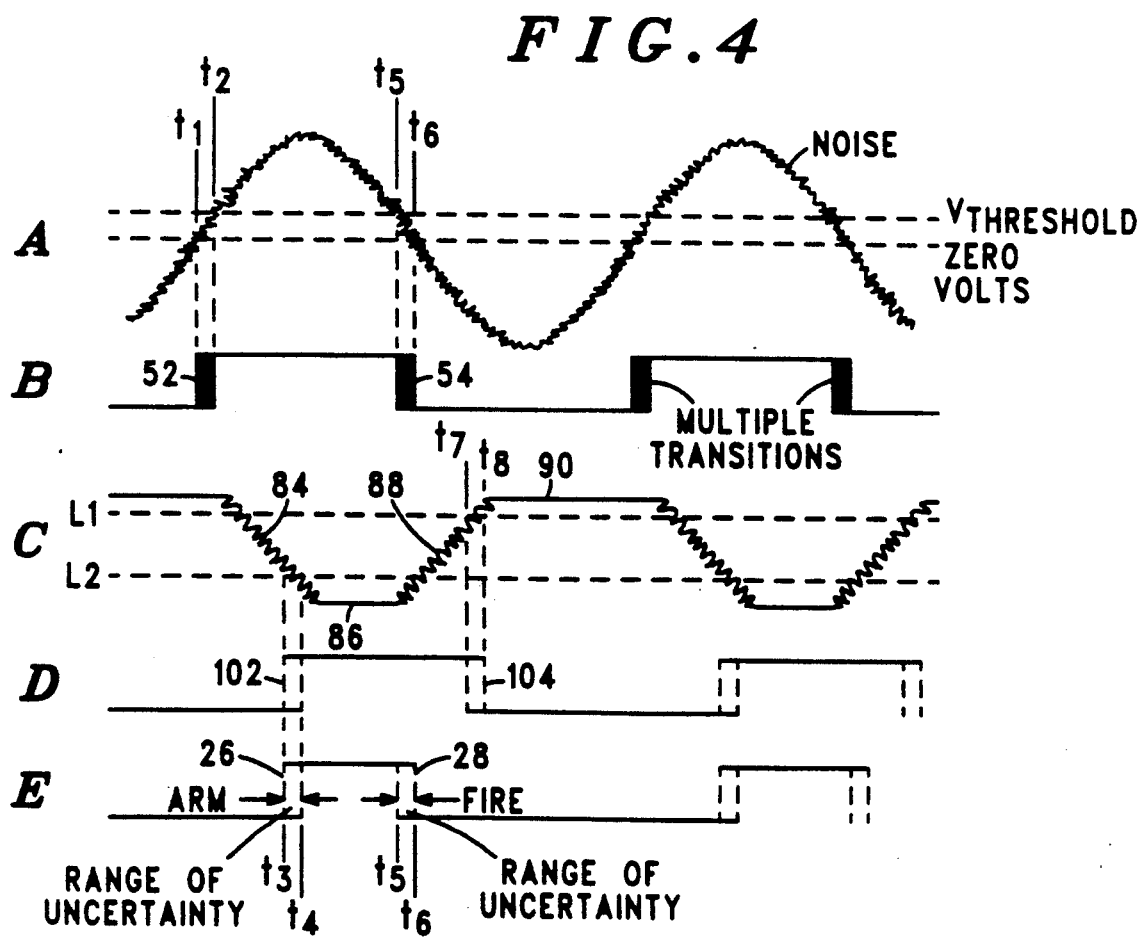
FIG.4

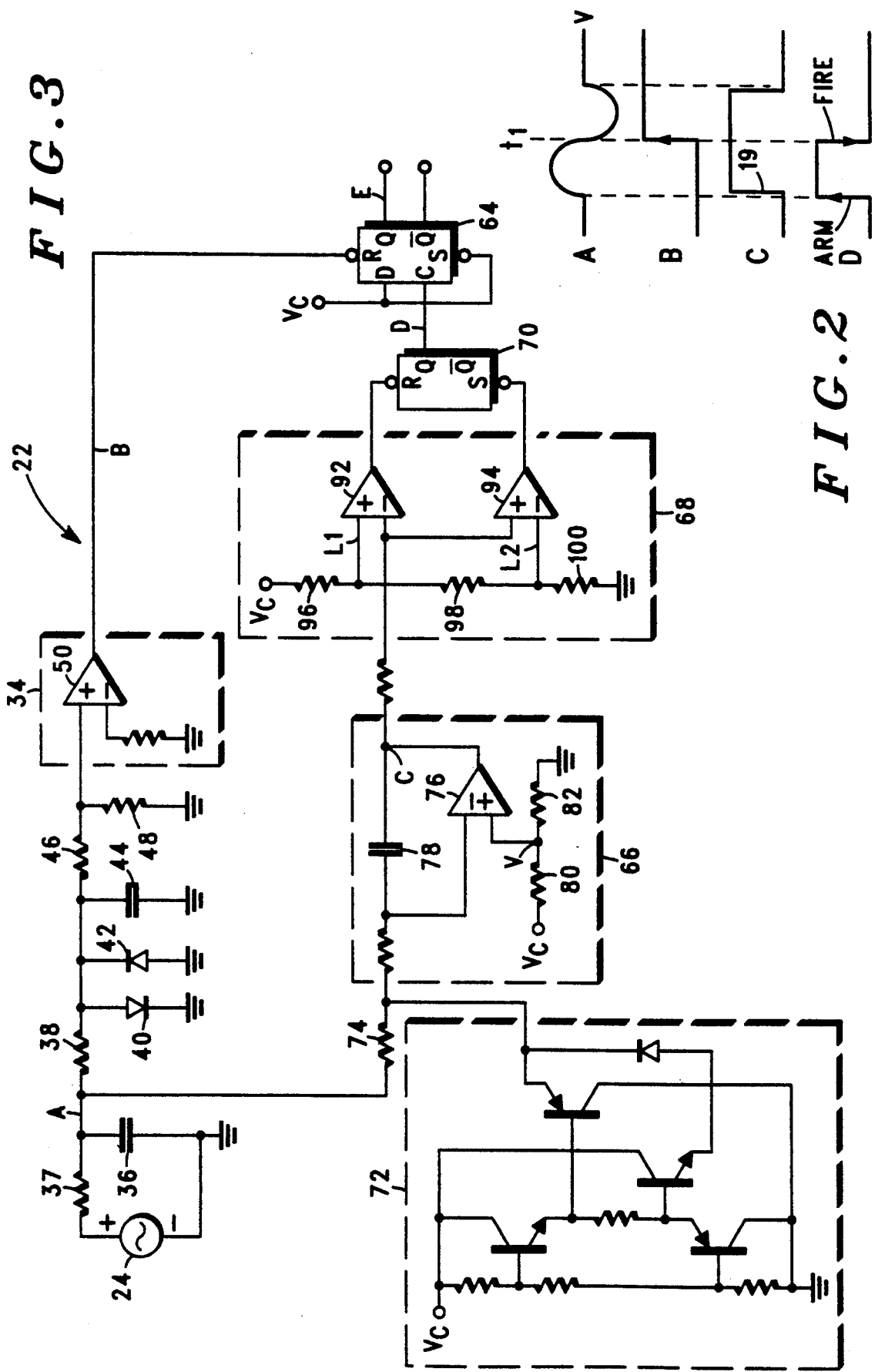

THRESHOLD CROSSING DETECTION WITH IMPROVED NOISE REJECTION

FIELD OF THE INVENTION

This invention is generally directed to an improved method and circuitry for detecting a threshold crossing in the output signal of a sensor, and for generating a further, typically binary, signal that is representative of the threshold crossing and that is relatively stable in the presence of noise superimposed on the sensor signal. In a typical application, the sensor may be an automotive reluctance sensor whose threshold crossing is used to establish engine position, typically used for the proper timing for fuel injection or ignition firing.

BACKGROUND OF THE INVENTION

In a prior art threshold detector (sometimes referred to as a "zero-crossing" detector), the output of a sensor is processed by circuitry such as that shown in FIG. 1.

In the illustrated arrangement, a sensor 10 (such as a reluctance sensor) develops an output signal A which, as shown by waveform A in FIG. 2, appears as a sinusoidal type signal superimposed on a bias level V. At time $t_1$, the signal A crosses the level V, thereby generating a "threshold-crossing". In the case where the threshold level V is zero volts, the transition at $t_1$ is referred to as a "zero-crossing". The purpose of the circuitry shown in FIG. 1 is to develop a binary level output signal (waveform D in FIG. 2) having a single "arm" transition and a single "fire" transition (as opposed to multiple, unwanted transitions), even in the case where a substantial amount of noise is present on the input signal A.

Referring again to FIG. 1, the signal A is coupled to the input of a zero-crossing (or threshold-crossing) detector 12 that generates a binary level output signal B (see waveform B in FIG. 2) having a positive-going transition that occurs at time $t_1$.

The sensor signal A is also applied to an integrator 14 which applies an integrated version of the signal A to a threshold detector 16. The output of the detector 16 is a binary signal C (see waveform C in FIG. 2). This signal C is applied to the clock (C) input of a flip-flop 18, while the signal B is applied to the reset (R) input of the same flip-flop.

The purpose of the flip-flop is to generate a noise-free output signal D (waveform D in FIG. 2) whose "arm" transition establishes an amplitude level from which one can generate the "fire" transition. Although the stability and accuracy of the "fire" transition is important insofar as it gets counted, or otherwise used, to form a timing reference, the stability of the "arm" transition is also important. If the "arm" transition jitters in the presence of noise, the circuitry which processes the signal D may operate improperly. For purposes of this disclosure, a signal which "jitters" is one which has multiple, noise induced, transitions between a high level and a low level, as opposed to a single transition between the same levels.

To stabilize the "arm" transition, the threshold detector 16 typically includes a single comparator with hysteresis. When the comparator fires, it generates the transition 19 (FIG. 2), and the hysteresis associated with the comparator prevents the comparator from generating additional transitions in response to noise that does not exceed the hysteresis range.

Unfortunately, it is impractical to construct a single comparator which can apply sufficient hysteresis in time to reject high levels of noise. Consequently, conventional threshold crossing detectors, such as shown in FIG. 1, develop output signals (waveform D) whose "arm" transitions tend to jitter when moderate or high levels of noise are present.

OBJECT OF THE INVENTION

It is a general object of the invention to provide an improved method and circuitry for producing an output signal representing the threshold crossing of a sensor signal.

It is a more specific object of the invention to provide such a method and circuitry that provides a more stable "arm" transition in the output signal.

BRIEF DESCRIPTION OF THE FIGURES

FIG. 1, previously discussed, shows a conventional threshold crossing detector,

FIG. 2 shows various waveforms produced by the detector of FIG. 1;

FIG. 3 is a schematic diagram of a threshold crossing detector in accordance with the invention; and FIG. 4 shows various waveforms produced by the detector of FIG. 3.

DESCRIPTION OF THE PREFERRED EMBODIMENT

Referring now to FIG. 3, there is shown a threshold crossing detector 22 in accordance with the invention. Generally, the detector 22 receives a sensor input signal on a lead A from a sensor 24 (such as an automotive reluctance sensor, for example), and processes the sensor input signal so as to form an output signal on lead E. (The signals carried by leads A-E are shown as signals A-E respectively, in FIG. 4). This output signal E is preferably a binary level signal having abrupt, stable transitions, with one of the transitions being representative of a threshold crossing that occurs in the sensor input signal A.

The signal A typically appears as a sinusoidal signal, and, as shown in FIG. 4., some noise is usually superimposed on it. In some cases, the noise on the signal A may be in the order of volts, perhaps even tens of volts in extreme cases. Because threshold detecting circuitry tends to be sensitive to amplitude excursions, such noise on the signal A can give rise to extra, unwanted transitions (i.e., jitter) in the output signal E.

Referring to the illustrated signal E, this signal includes a single positive-going transition 26 that is referred to as the "arm" transition, and a single negative-going transition 28 that is referred to as the "fire" transition. Typically, the "fire" transition is counted or otherwise processed to control fuel injection, ignition timing, or the like.

As shown by the dashed lines at times t3 and t4, a range of uncertainty exists as to when the transition 26 will occur. That is, the transition 26 could occur anywhere between the times t3 and t4, depending on the noise carried by the signal A. But the present invention insures that only one such transition 26 does occur within that range of uncertainty, even in very noisy conditions.

Likewise, noise on the signal A can cause the "fire" transition 28 to occur anywhere between the times t5 and t6, but only one "fire" transition will occur. That one "fire" transition will be generated in response to the first transition that occurs in the signal B around the times t5-t6 (the signal B is discussed more fully below).

Referring again to FIG. 3, the sensor input signal A is applied to one of two signal processing paths. One of these paths includes a detector 34 that develops an output signal B having a transition that is representative of the zero crossing in the sensor input signal. In the ideal situation where no noise is carried by the signal A, the signal B will develop only one transition each time a zero crossing occurs in the signal A. As discussed below, this ideal situation is not expected to occur often.

To develop the signal B, the signal A may be applied to a filter/clamp circuit comprising a capacitor 36, resistors 37 and 38, diodes 40 and 42, another (smaller) capacitor 44, and resistors 46, 48. The resistor 37 and the capacitor 36 are selected to provide a pole to remove some high frequency noise from the sensor input signal. The diodes 40, 42 limit the amplitude of the sensor input signal to plus and minus one diode drop. The combination of resistors 38, 46 and 48 limit the signal input to the detector 34 to about 45% of one diode drop.

The detector 34 is illustrated as including a conventional ground-referenced, non-inverting comparator 50 whose operation will now be described with reference to the signals shown in FIG. 4.

Referring first to the sensor input signal A, it can be seen that this signal is accompanied by a certain amount of noise which causes the signal A to cross the zero volt level several times between t1 and t2. The comparator 50 responds to these crossings by developing the signal B which has multiple possible transitions 52 (one for each zero-crossing of the signal A between times t1 and t2), and multiple possible transitions 54 (one for each zero-crossing of the signal A between times t5 and t6). If smaller amplitude noise appears on the signal A, it is possible that the signal B will have just one transition 52 and one transition 54, but these single transitions may move around somewhat to follow the noise-induced movement of the zero-crossings in the signal A.

Referring back to FIG. 3, the signal B is applied to the reset (R) input of a flip-flop 64 which logically combines the signal B with another signal D, as will be subsequently described.

The second signal processing path for the sensor input signal includes an integrator 66, comparison circuitry 68, and a flip-flop 70 which develops the signal D. The sensor input signal is first coupled to a clamp circuit 72 via a resistor 74. Suffice it to say that this clamp circuit limits the signal that is applied to the integrator 66 to a safe level.

The integrator 66 is conventional, and includes an operational amplifier 76 and a capacitor 78 coupled between the input and the output of the amplifier 76. This configuration provides a single-ended, inverting integrator. The non-inverting input thereof is coupled to a reference level V (provided by Vc and resistors 80, 82) that is slightly above ground to assure that, with no signal input, the output of the integrator will be at a high level. The reference level V is shown greatly enlarged in FIG. 4, signal A.

In operation, a positive-going excursion of the signal A beyond the level V results in the integrator developing a negative-going excursion 84 in its output signal C. When the signal A reaches an amplitude that the integrator cannot follow, the integrator's output signal C bottoms out at level 86. The negative-going excursion of the signal A results in a positive-going excursion 88, followed by another flat level 90. It will be appreciated that the signal C includes a smaller amount of noise than the signal A because of the filtering action of the integrator.

Referring now to the comparison circuitry 68, it includes a first comparator 92, a second comparator 94, and resistors 96, 98, and 100. These resistors are coupled between a supply voltage $V_C$ and ground to provide two reference levels for the comparators. The comparator 92 receives a first reference level L1 at its (+) input, while the other comparator 94 receives a second reference level L2 at its (−) input. These reference levels L1 and L2 are selected to provide the comparison circuitry 68 with the effect of a broad range of hysteresis so as to substantially reduce or eliminate the effects of noise carried by the signal C. Preferably, the levels L1 and L2 are chosen, as shown in FIG. 4 (signal C), such that they are near the extremes of the amplitude excursions of the signal C. As shown, the signal C has an upper amplitude extreme 90 and a lower amplitude extreme 86. The level L1 is selected to be near the level 90, and the level L2 is selected to be near the level 86.

The actual values of the levels L1 and L2 will depend on the characteristics of the components used to form the integrator 66 and the comparison circuitry 68. The most significant characteristics are the output limits of the operational amplifier 76 and the input limits of the comparators 92, 94. Typically, the levels L1 and L2 will be selected to be spaced apart from each other as far as is safely practical, taking into account the above-mentioned limits. In the embodiment shown in FIG. 1, the level L1 may be +3 volts, and the level L2 may be +1 volt.

The output of the comparator 92 is coupled to the reset (R) input of the flip-flop 70, and the output of the comparator 94 is coupled to the set (S) input of the same flip-flop. With this configuration, the comparators and the flip-flop 70 operate to produce an intermediate output signal D. The development of the signal D will now be described more fully with reference to FIG. 4.

When the integrated sensor signal C extends below the reference level L2, the comparator 94 fires and sets the flip-flop 70. Due to noise on the signal C, the crossing of the reference level L2 may occur one or more times between the times t3 and t4. Nevertheless, only the first such crossing results in the signal D being set to a first (e.g. high) state, as represented by the positive-going transition 102 which can occur anywhere between t3 and t4. The signal D thus is "latched" in the first state until the flip-flop 70 becomes reset.

The signal C then reaches its level 86, after which it experiences the upward excursion 88. These changes in the amplitude of the signal C have no effect on the signal D until the positive-going excursion 88 first reaches the level L1 between times t7 and t8. When that occurs, the comparator 92 fires and resets the flip-flop 70. Consequently, the signal D is set to a second (e.g., low) state via a negative-going transition 104.

A significant aspect of this operation is that only one transition 102 and one transition 104 are generated (even though the positions of transitions 102 and 104 may vary between times t3-t4 and t7-t8) so long as the noise level on the signal C is less than the voltage difference (typically 2 volts) between the levels L1 and L2. To obtain a two volt noise level on the signal C would require a noise level of tens of volts on the signal A. Clearly, the signal D has been made very noise resistant.

Turning now to the flip-flop 64, it receives the signal B at its reset (R) input and the signal D at its clock (C)

input. The set (S) and data (D) inputs are coupled to the power supply Vc, and the ultimate output signal is taken from either the Q or not-Q output. In this embodiment, the signal E, which is the ultimate output of the illustrated embodiment, appears at the Q output.

With the illustrated arrangement, the flip-flop 64 develops a binary level output signal E that has one amplitude transition 26 which is generated in response to the integrated sensor signal C first reaching one of the reference levels (e.g. reference level L2). The other amplitude transition 28 is generated in response to the transition 54 in the detector output signal B. As discussed earlier, the transition 26 may occur anywhere between times t3-t4, depending on the noise carried by the signal C. Likewise, the transition 28 may occur anywhere between times t5-t6, depending on where the first transition 54 (signal B) occurs. But multiples of the transition 26 will not occur unless extremely high levels of noise are present, such as when the level of noise approaches the level of the signal A. Consequently, the circuitry which processes the signal E is more likely to operate properly in relatively high noise levels.

In accordance with the above-mentioned objects of the invention, a more stable "arm" transition has been provided for the output signal of the threshold crossing detector. As a result, the output signal E remains usable and stable in circumstances where less noise-resistant threshold crossing detectors produce output signals of marginal utility.

Although the invention has been described in terms of a preferred embodiment, it will be obvious to those skilled in the art that many alternations and variations may be made without departing from the invention. Accordingly, it is intended that all such alternation and variation be considered as within the spirit and scope of the invention, as defined by the appended claims.

We claim:

1. In a signal processing system that includes: (a) a detector receiving a sensor input signal for developing a detector output signal indicative of a threshold-crossing in the sensor input signal; and (b) circuitry receiving the sensor input signal for generating an integrated sensor signal that is capable of experiencing amplitude excursions between two opposite extremes, a method of processing the integrated sensor signal and the detector output signal to form a binary level output signal, comprising:
    comparing the integrated sensor signal to a first reference level that is near one of the extreme amplitude excursions of the integrated sensor signal;
    comparing the integrated sensor signal to a second reference level that is near the other extreme amplitude excursion of the integrated sensor signal;
    generating an intermediate output signal that is set to a first state when the integrated sensor signal reaches the first reference level while undergoing an amplitude excursion in a first direction;
    setting the intermediate output signal to a second state when the integrated sensor signal reaches the second reference level while undergoing an amplitude excursion in a second, opposite direction after completing the excursion in the first direction; and
    logically combining the intermediate output signal with the detector output signal to develop the binary level output signal having a transition representative of the threshold-crossing of the sensor input signal.

2. A method as set forth in claim 1 wherein the intermediate output signal is latched to said first and second states in response to the integrated sensor signal reaching the first and second reference levels.

3. A method as set forth in claim 1 wherein the step of combining the intermediate output signal with the detector output signal comprises:
    providing a flip-flop; clocking the flip-flop with the intermediate output signal; and
    re-setting the flip-flop with the detector output signal.

4. A threshold crossing detector for generating a binary level output signal having a transition that is representative of a threshold crossing in a sensor input signal, comprising:
    means receiving the sensor input signal for developing a detector output signal having a transition representative of the threshold crossing in the sensor input signal;
    means receiving the sensor input signal for developing an integrated sensor signal that is capable of experiencing amplitude excursions between two opposite extremes;
    comparison circuitry for comparing the integrated sensor signal to a first reference level that is near one of the extreme amplitude excursions of the integrated sensor signal, and for comparing the integrated sensor signal to a second reference level that is near the other extreme amplitude excursion;
    means receiving the detector output signal and coupled to the comparison circuitry for developing the binary level output signal having one amplitude transition generated in response to the integrated sensor signal reaching one of the reference levels, and having another amplitude transition generated in response to said transition in the detector output signal.

5. A threshold crossing detector as set forth in claim 4 wherein the comparison circuitry includes a first comparator for comparing the integrated sensor signal to the first reference level, and a second comparator for comparing the integrated sensor signal to the second reference level.

6. A threshold crossing detector as set forth in claim 5 wherein said means for developing the binary level output signal includes a flip-flop that is coupled to outputs of the first and second comparators for developing an intermediate output signal.

7. A threshold crossing detector as set forth in claim 6 wherein the flip-flop is reset by the output from one of the comparators and is set by the output of the other comparator.

8. A threshold crossing detector as set forth in claim 6 wherein the means for developing the binary level output signal further includes a logic circuit receiving the detector output signal and the intermediate output signal.

9. A threshold crossing detector as set forth in claim 8 wherein the logic circuit includes a flip-flop that is clocked by the intermediate output signal.

10. A threshold crossing detector for generating a binary level output signal having a transition that is representative of a threshold crossing in a sensor input signal, comprising:
    means receiving the sensor input signal for developing a detector output signal having a transition that is representative of the threshold crossing in the sensor input signal;

means receiving the sensor input signal for developing an integrated sensor signal that is capable of experiencing amplitude excursions between two opposite extremes;

a first comparator for comparing the integrated sensor signal to a first reference level that is near one of the extreme amplitude excursions of the integrated sensor signal, and for developing an output responsive to the integrated sensor signal reaching the first reference level;

a second comparator for comparing the integrated sensor signal to a second reference level that is near one of the extreme amplitude excursions of the integrated sensor signal, and for developing an output responsive to the integrated signal reaching the second reference level;

a first flip-flop receiving the outputs of the first and second comparators for developing an intermediate output signal; and a second flip-flop receiving the intermediate output signal and the detector output signal for generating the binary level output signal.

* * * * *